United States Patent [19]
Thanh et al.

[11] Patent Number: 4,916,261
[45] Date of Patent: Apr. 10, 1990

[54] CIRCUIT SUBSTRATE AND PRODUCING METHOD OF THE SAME

[75] Inventors: Truong D. Thanh, Kawasaki; Nobuo Iwase, Kamakura, both of Japan

[73] Assignee: Kabushiki Kaisha Toshiba, Kawasaki, Japan

[21] Appl. No.: 648,304

[22] Filed: Sep. 7, 1984

[30] Foreign Application Priority Data

Sep. 9, 1983 [JP] Japan .................. 58-165154
Feb. 27, 1984 [JP] Japan .................. 59-34160
May 18, 1984 [JP] Japan .................. 59-98792

[51] Int. Cl.$^4$ .................. C04B 35/46; C04B 35/00
[52] U.S. Cl. .................. 174/255; 428/471; 501/135; 501/139
[58] Field of Search .................. 501/135, 139; 428/471; 174/68.5

[56] References Cited

U.S. PATENT DOCUMENTS 4,106,075  8/1978  Baumann et al. .................. 501/134

FOREIGN PATENT DOCUMENTS 0065863  12/1982  European Pat. Off. .
1802452   4/1973  Fed. Rep. of Germany .
55-10926  3/1980  Japan .................. 552/62.9
WO83/03823 11/1983 PCT Int'l Appl. .
2084986   4/1982  United Kingdom .

OTHER PUBLICATIONS

Diman, Ye. N. and Bekrasov, I. Ya., "Hydrothermal Synthesis of Nordenskioldine and its Analgues", Doklady Akad. Nauk SSSR, vol. 164, No. 4, pp. 129-133 (1965).
Aleonard, S. and Vicat, J., "Borates de Structure Dolomie", Bull. Soc. Franc. Miner. Crist., vol. 89, pp. 271-272 (1966).
Bayer, G., "Thermal Expansion Anisotropy of Dolomite-type Borates $Me^{+2}Me^{+4}B_2O_6$", Zeitschrift fur Kristallographie, Bd. 133, S. 85-90 (1971).
Matsuo et al, "Electric Insulator Ceramic", Chemical Abstracts, vol. 91, No. 116272y, p. 581.

Primary Examiner—Mark L. Bell
Attorney, Agent, or Firm—Foley & Lardner, Schwartz, Jeffery, Schwaab, Mack, Blumenthal & Evans

[57] ABSTRACT

A circuit substrate comprises a sintered oxide body of barium, tin and boron as an insulating body which is able to be fired at a temperature less than 1300° C. The circuit substrate is further improved in moisture resistance by containing titanium or securing substantially the composition of $BaSn(BO_3)_2$.

12 Claims, 1 Drawing Sheet

CIRCUIT SUBSTRATE AND PRODUCING METHOD OF THE SAME

BACKGROUND OF THE INVENTION

1. Field of the Invention

The present invention relates to a circuit substrate, and more specifically a circuit substrate which can be baked or fired at a low temperature.

2. Description of the Prior Art

One of the most common ceramic materials used for circuit substrates in the prior art is alumina, which has good insulating qualities for use with products such as circuit substrates.

However, alumina requires a high baking or firing temperature in the region of 1500° C. to 1600° C. and there is only a limited number of types of conducting pastes which can be used with alumina circuit substrates. For example, with a multilayer circuit substrate in which the conducting paste and substrate are sintered at the same time, it is necessary to use conducting pastes of such as tungsten and molybdenum which can adequately resist the firing temperatures used with alumina. However, the electrical resistivities of tungsten and molybdenum are large, that is at $5.2\times10^{-6}$ ohm-cm and $5.5\times10^{-6}$ ohm-cm respectively, which are three times the resistivity of silver at $1.6\times10^{-6}$ ohm-cm. Accordingly, in order to get conducting circuits of the same conductivity, it is necessary to make the conductor width about three times as large, resulting in the drawback that high density wiring is not possible.

Attempts have been made to add a glass component to reduce the firing temperature, but there is the problem of migration with multilayered wiring, and practical application of such a material is not desirable.

In addition, a circuit substrate must be moisture resistant.

It is therefore desirable to develop a circuit substrate which can be baked or fired at low temperatures without a deterioration in the insulating characteristics, in order to eliminate such drawbacks and problems which exist in the conventional technology.

SUMMARY OF THE INVENTION

Accordingly, the object of the present invention is to provide a circuit substrate which is able to be baked or fired at a low temperature.

Another object of the present invention is to provide a circuit substrate which has superior resistance to moisture, as well as being able to be baked at a low temperature.

In a first embodiment of the present invention, a circuit substrate is provided with an insulating member comprising a sintered oxide body essentially consisting of barium, tin and boron equivalent to the following.
  BaO: 10 to 68 mol %
  $SnO_2$: 9 to 50 mol %
  $B_2O_3$: 13 to 72 mol %

In a second embodiment of the present invention, a circuit substrate is provided with an insulating member comprising a sintered oxide body essentially consisting of barium, tin, boron and titanium equivalent to the following.
  BaO: 8 to 54 mol %
  $SnO_2$: 7 to 40 mol %
  $B_2O_3$: 10 to 58 mol %
  $TiO_2$: 5 to 48 mol %

In a third embodiment of the present invention, a circuit substrate is provided with an insulating member comprising a sintered oxide body essentially consisting of barium, tin and boron equivalent to:
  BaO: 10 to 68 mol %
  $SnO_2$: 9 to 50 mol %
  $B_2O_3$: 13 to 72 mol %
wherein BaSn $(BO_3)_2$ greater than 90 mol % is formed.

DETAILED DESCRIPTION OF THE INVENTION

Figure 1:
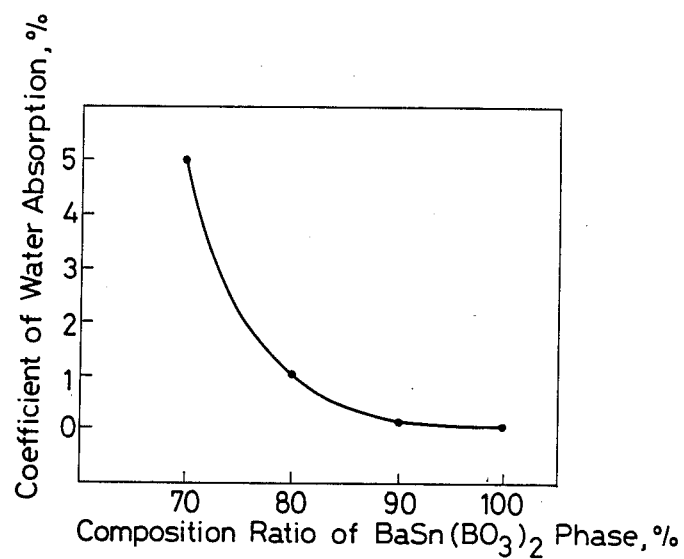
FIGS. 1, 2, and 3 are characteristic curves showing change in the characteristics with change in the amount of Ba Sn $(BO_3)_2$.

The sintered oxide body which is used as an insulating body in the circuit substrate according to the present invention, in the first aspect of the present invention, essentially consists of barium, tin and boron in composition equivalent to the following.
  BaO: 10 to 68 mol %
  $SnO_2$: 9 to 50 mol %
  $B_2O_3$: 13 to 72 mol %

As the result of having such a composition, it is possible to obtain a circuit substrate which can be baked or fired at a low temperature, that is, a temperature of less than 1300° C. This substrate is suitable for use as a hybrid substrate on which an LSI chip is directly mounted, because it has a small coefficient of thermal expansion ($\alpha$), being 3.5 to 8 ($\times 10^{-6}/°C$.), in the same range as that of silicon ($4\times10^{-6}/°C$.). In addition, it has other desirable characteristics, for example, a dielectric constant ($\epsilon s$) of about 7.2 to 10.5, a dielectric loss ($\tan\delta$) of 0.7 to 5 ($\times 10^{-3}$), an insulation resistance ($\rho$) of 0.8 to 16.5 ($\times 10^{13}$ ohm-cm), which are adequate for a circuit substrate. In addition, it has adequate strength, having a flexural strength of at least 1000 kg/cm².

In addition, the sintered oxide body which is used as an insulating body in the circuit substrate of the present invention, in the second embodiment of the present invention essentially consists of barium, tin, boron and titanium in composition equivalent to the following.
  BaO: 8 to 54 mol %
  $SnO_2$: 7 to 40 mol %
  $B_2O_3$: 10 to 58 mol %
  $TiO_2$: 5 to 48 mol %

As the result of having such a composition, it is possible to obtain a circuit substrate which can be baked or fired at a low temperature, that is, a temperature of less than 1300° C. This substrate has a small coefficient of thermal expansion ($\alpha$), being below $9\times10^{-6}/°C$. In addition, it has other desirable characteristics, for example, a dielectric constant ($\epsilon s$) of below 12, a dielectric loss ($\tan\delta$) below $1.2\times10^{-3}$, an insulation resistance ($\rho$) of above $0.7\times10^{13}$ ohm-cm, all of which are adequate for a circuit substrate. In addition, it has adequate strength, having a flexural strength of at least 1700 kg/cm².

Furthermore, the circuit substrate in the second embodiment, as compared with the first embodiment, has an increased resistance to moisture.

The moisture resistance of a circuit is an important factor in keeping its characteristics, such as its insulating qualities when the circuit substrate is being used in a highly humid environment or one in which water is present.

In the present invention, the amount of each component is limited according to the reasons outlined below.

If the $SnO_2$ component which has basically the character of a semiconductor is present in too large quantity, the insulation resistance is lowered, so that the characteristics of an insulating substrate are no longer satisfied. In addition, both the dielectric loss and the dielectric constant become large, and the high frequency characteristics and the high wiring density property will deteriorate. On the other hand, if the proportion of $SnO_2$ is too small, the coefficient of thermal expansion will become too large, and in the case where an LSI chip is mounted, for example, the chip becomes easily warped or bent.

If the BaO component is present in too large quantity, the substrate tends to become fragile and lacking in strength, while, as the quantity becomes smaller, the coefficient of thermal expansion becomes larger. Especially in the area where barium is small, when the quantity of boron becomes large, there is a remarkable deterioration in the coefficient of thermal expansion, while when the quantity of boron decreases, there is a remarkable deterioration in dielectric loss.

The next component is $B_2O_3$, and when the quantity of boron becomes too small, the main object of the present invention, that is, low temperature baking or firing, is not attained, inasmuch as a baking temperature in excess of 1300° C. becomes necessary. If the quantity of boron becomes too large, the coefficient of thermal expansion also increases.

$B_2O_3$ has the largest effect on the baking or sintering temperature, specifically the $B_2O_3$ content of at least 36 mol %, especially in the range between 36 and 49 mol %, is desirable, and most suitable for use with a silver-based, low-temperature baking conducting paste.

Further, in consideration of the characteristics such as the coefficient of thermal expansion, the range of 36 to 49 mol % $B_2O_3$ with 31 to 40 mol % $SnO_2$ and 18 to 28 mol % BaO is desirable. This is most suitable for a multilayer wired substrate carrying an LSI chip.

In the second embodiment of the circuit substrate of the present invention, the resistance to environmental conditions is considerably increased by the inclusion of $TiO_2$. That is to say, when the substrate is used in a normal environment, the effect of humidity cannot be neglected. By the inclusion of $TiO_2$ the resistance to humidity is increased. $TiO_2$ less than 5 mol % will cause the coefficient of water absorption to increase so that in an environment with high humidity, or in an environment in which water is present, there is the worry that the insulation resistance will drop when a circuit substrate is used therein. On the other hand, when 48 mol % is exceeded, other characteristics such as the dielectric constant tend to deteriorate.

In this way, the present invention can provide a substrate with insulating properties, fired at a temperature below 1300° C., and by choice of suitable components, at temperatures between 800° C. and 1200° C. This is extremely effective, because it is possible to use, in the place of W and Mo, pastes for low-temperature firing such as Ag-based pastes, such as Ag, Ag-Pd, and Ag-Pt, and Cu pastes, which are low sheet-resistant. Also, this is highly effective in reducing energy costs in the manufacturing process because of the reduction in the firing temperature.

Here we will specifically compare a circuit substrate according to the present invention, in the suitable range, with a conventional $Al_2O_3$ substrate. The $Al_2O_3$ substrate contains 92 to 93% $Al_2O_3$, has a firing temperature of 1500° to 1600° C., $\epsilon s = 10.5$ to 12, $\tan\delta = 2$ to $5 \times 10^{-3}$, $\rho \times 0.2$ to $5 \times 10^{13}$, $\alpha =$ about $8 \times 10^{-6}$/°C.

On the other hand, the circuit substrate of the present invention in the range—$SnO_2$ 20 to 45 mol %, BaO 17 to 48 mol %, and $B_2O_3$ 23 to 56 mol %, with a coefficient of thermal expansion below $6.1 \times 10^{-6}$/°C., can be manufactured at a firing temperature below 1100° C., and is extremely effective because it can be a low-temperature sintered substrate with better characteristics than the $Al_2O_3$ substrate.

Also, the circuit substrate of the present invention in the range—$SnO_2$ 12 to 38 mol %, BaO 11 to 36 mol %, $B_2O_3$ 14 to 45 mol %, and $TiO_2$ 7 to 40 mol %, can be manufactured at a firing temperature below 1100° C., and is extremely effective because it can be a low-temperature sintered substrate with superior characteristics, e.g. $\alpha \leq 6.5 \times 10^{-6}$/°C.

Furthermore, when the circuit substrate of the present invention is in the range—$SnO_2$ 11 to 32 mol %, BaO 12 to 35 mol %, $B_2O_3$ 15 to 40 mol %, and $TiO_2$ 10 to 36 mol %, it has a coefficient of water absorption about ½ that of a glass-epoxy substrate. From the aspect of resistance to moisture, this is an especially desirable component range.

In addition, in the circuit substrate in the first embodiment of the present invention, by adjusting to a content of Ba Sn $(BO_3)_2$ greater than 90 mol %, the coefficient of water absorption is reduced to less than 0.01%, and, especially when Ba Sn $(BO_3)_2$ is greater than 95%, a material with highly superior moisture resistant characteristics is obtained. Accordingly, when used under conditions of high humidity, or in the case where water is present in the environment, an extremely effective performance is obtained. It is also possible to obtain a circuit substrate according to this composition which can have a firing temperature less than 1200° C., in the especially low firing temperature range of 900° C. to 1000° C. Then, this substrate has a low coefficient of thermal expansion ($\alpha$) of 3.5 to 8 ($10^{-6}$/°C.), which is about the same level as that of silicon ($4 \times 10^{-6}$/°C.). Other characteristics, such as a dielectric constant ($\epsilon s$) of about 9.5 to 10.5, dielectric loss ($\tan\delta$) of 2 to 5 ($\times 10^{-3}$), insulation resistance ($\rho$) of $10^{14}$ ohm-cm make this material suitable as a circuit substrate. In addition, the present substrate has a flexural strength of at least 1000 kg/cm².

When the ratio of Ba Sn $(BO_3)_2$ is adjusted, this ratio goes through a large change, depending on the manufacturing conditions, and especially on pre-baking or calcination conditions. A manufacturing method in which the ratio of at least 90 mol % is obtained will be described later.

The circuit substrate of the present invention gives particularly superior service as a substrate for simultaneous firing, having multilayered wiring by means of integral sintering.

This circuit substrate is very effective when used as a multilayer wiring substrate by integral sintering, as the inter-layer insulation is highly reliable. In addition, because the coefficient of thermal expansion can be made small, the substrate is highly effective for use with a high density hybrid IC loaded directly on an LSI chip.

When W or Mo conducting paste is used with the conventional $Al_2O_3$ substrates, it is necessary to perform simultaneous sintering in a reducing atmosphere. However, the present invention can provide an insulating layer which can be fired at a low temperature, and the firing can be performed in air, because it is possible to use Ag-, Au-, Cu-, and Ni-based pastes. In this way, production is simple and costs are reduced. Also, because there is no glass component through the substrate, a dense structure is obtained, with very few vacant holes. No migration is experienced even if Ag-based pastes are used. Accordingly high density wiring is possible. It is also possible to reduce the amount of such materials as Pd in an Ag-based paste, providing a superior substrate from the aspect of cost.

Thermal expansion can also be minimized, so that this substrate is highly effective for use with a high density hybrid IC loaded directly on an LSI chip.

In addition, production equipment is simplified, and the operation is made easier.

EXAMPLES OF THE INVENTION

Here, we will further explain the present invention with reference to some examples. The circuit substrates according to the present examples were manufactured in the following ways.

EXAMPLE 1

First the powdered raw materials BaO, $B_2O_3$, $SnO_2$, and, as required, $TiO_2$ were blended in a desired component ratio. The blended powder was then placed together with alumina balls within a pot made from alumina and then subjected to wet grinding in a vibration mill for about 16 hours. This powdered raw material may be, for example, carbonates and the like which is converted to oxide after sintering. With this example of the present invention, $BaCO_3$, $H_3BO_3$, $SnO_2$, and, as required, $TiO_2$ were used. Next, drying was carried out to drive off the water, and after a pre-baking or calcination in which heating was carried out for about 3 hours at 1000° C. to 1400° C., the material was once again placed in the alumina pot and subjected to about 30 hours of wet grinding. Next, a binder such as polyvinyl alcohol (PVA) was added, granulating was carried out, and pellets were produced.

Following this, the pellets were filled into a mold and subjected to a forming pressure of 1000 kg/cm$^2$, and were heated in air for three hours at 800° C. to 1200° C., and prepared as samples.

Disk-shaped samples of 22 mm diameter and 1 mm thickness, rod-shaped samples of 20×3.5×3.5 mm thickness, and rectangular samples 20×10×2 mm were prepared, and the characteristics measured. The results are shown in Table I. For measurement of dielectric constants and dielectric loss, and insulation resistance, circular electrodes were formed as follows. Ag-paste was printed in a concentric circular pattern on both sides of the disk-shaped sample, by 325 mesh screen printing, and after drying, was heated at 750° C. in air for 20 minutes. Circular electrodes, 20 mm in diameter by 15 μm thickness, were then formed and the measurements made. The dielectric constant and dielectric loss are the values at 1 MHz, and the insulation resistance is the lowest value taken one minute after applying 1000 V at conditions of 25° C., and 50% relative humidity. Also, the coefficient of thermal expansion was measured at temperatures from 25° C. to 500° C., using the rod-shaped samples.

The coefficient of water absorption is the value from the pressure cooker test at 121° C., 2 kg/cm$^2$, in steam. The values (mg/cm$^3$) were obtained from the change in weight per unit volume throughout the test.

The values in Table I are the averages of 10 samples of the same composition.

The same tests were made for samples outside of the composition range of the present invention (Samples Nos. 26 to 30, and Nos. 46 to 49), and these values are also given in Table 1.

TABLE I (1)

| Sample No. | Composition in ratio (mol %) BaO | $SnO_2$ | $B_2O_3$ | Firing temp. (°C.) | Values of characteristics $\epsilon_s$ [1 MHz] | tan δ [1 MHz] ($10^{-3}$) | ρ ($10^{13}$ Ω·cm) | α ($10^{-6}$/C) |
|---|---|---|---|---|---|---|---|---|
| 1 | 39.48 | 47.36 | 13.16 | 1250 | 10.2 | 4.0 | 0.9 | 3.5 |
| 2 | 68.00 | 19.00 | 13.00 | 1300 | 8.0 | 3.3 | 12.0 | 5.2 |
| 3 | 68.00 | 9.00 | 23.00 | 1150 | 8.8 | 4.2 | 13.0 | 5.5 |
| 4 | 18.18 | 10.00 | 71.82 | 780 | 7.2 | 0.7 | 10.5 | 8.0 |
| 5 | 10.53 | 18.50 | 70.97 | 800 | 7.5 | 0.9 | 9.5 | 7.5 |
| 6 | 10.53 | 47.36 | 42.11 | 950 | 10.5 | 5.0 | 0.8 | 4.0 |
| 7 | 31.94 | 42.67 | 25.39 | 1030 | 9.0 | 1.3 | 14.0 | 4.2 |
| 8 | 48.00 | 28.47 | 23.53 | 1100 | 8.5 | 4.5 | 12.5 | 4.5 |
| 9 | 48.00 | 20.00 | 32.00 | 1050 | 8.0 | 3.2 | 11.0 | 5.0 |
| 10 | 24.00 | 20.00 | 56.00 | 850 | 8.3 | 1.2 | 7.0 | 6.1 |
| 11 | 17.65 | 26.35 | 56.00 | 880 | 8.5 | 1.5 | 4.0 | 6.0 |
| 12 | 18.18 | 39.39 | 42.43 | 950 | 9.5 | 4.0 | 1.5 | 4.3 |
| 13 | 18.50 | 21.50 | 60.00 | 830 | 8.2 | 1.2 | 7.5 | 6.4 |
| 14 | 24.50 | 45.00 | 30.50 | 1050 | 9.5 | 2.0 | 12.0 | 4.2 |
| 15 | 35.29 | 41.18 | 23.53 | 1070 | 8.7 | 1.5 | 15.0 | 4.0 |

TABLE I (2)

| Sample No. | Composition in ratio (mol %) BaO | $SnO_2$ | $B_2O_3$ | Firing temp. (°C.) | Values of characteristics $\epsilon_s$ [1 MHz] | tan δ [1 MHz] ($10^{-3}$) | ρ ($10^{13}$ Ω·cm) | α ($10^{-6}$/C) |
|---|---|---|---|---|---|---|---|---|
| 16 | 38.46 | 23.08 | 38.46 | 1000 | 7.8 | 1.5 | 16.5 | 5.5 |
| 17 | 38.46 | 31.24 | 30.30 | 1050 | 8.0 | 2.6 | 14.5 | 4.7 |
| 18 | 33.33 | 33.33 | 33.34 | 1020 | 8.1 | 3.0 | 14.0 | 4.5 |
| 19 | 23.08 | 23.08 | 53.84 | 870 | 8.4 | 1.3 | 5.5 | 5.6 |
| 20 | 30.30 | 39.40 | 30.30 | 1030 | 9.4 | 3.5 | 13.0 | 4.3 |
| 21 | 18.18 | 27.98 | 53.84 | 900 | 9.2 | 2.0 | 3.5 | 5.4 |
| 22 | 39.15 | 14.25 | 46.60 | 980 | 8.5 | 3.0 | 8.0 | 6.5 |
| 23 | 58.50 | 18.70 | 22.80 | 1120 | 8.7 | 4.1 | 12.0 | 5.2 |
| 24 | 45.10 | 37.50 | 17.40 | 1150 | 8.4 | 3.5 | 13.5 | 4.1 |
| 25 | 17.50 | 47.20 | 35.30 | 980 | 9.9 | 4.5 | 1.2 | 4.2 |

TABLE I (2)-continued

| Sample No. | Composition in ratio (mol %) | | | Firing temp. (°C.) | Values of characteristics | | | |
|---|---|---|---|---|---|---|---|---|
| | BaO | SnO$_2$ | B$_2$O$_3$ | | $\epsilon_s$ [1 MHz] | tan δ [1 MHz] ($10^{-3}$) | $\rho$ ($10^{13}$ Ω·cm) | $\alpha$ ($10^{-6}$/C) |
| 26 | 16.50 | 65.25 | 18.25 | 1350 | 12.0 | 0.2 | 0.05 | 4.0 |
| 27 | 4.25 | 45.25 | 50.50 | 970 | 10.0 | 0.9 | 0.07 | 4.5 |
| 28 | 8.21 | 9.49 | 82.30 | 720 | 7.0 | 0.5 | 20.0 | 8.4 |
| 29 | 44.50 | 3.40 | 52.10 | 915 | 7.2 | 0.6 | 13.0 | 8.2 |
| 30 | 57.20 | 38.50 | 4.30 | 1750 | 9.5 | 4.0 | 15.0 | 5.0 |

TABLE I (3)

| Sample No. | Composition in ratio (mol %) | | | | Firing temp. (°C.) | Values of characteristics | | | | Coefficient of water absorption (mg/cm$^3$) | |
|---|---|---|---|---|---|---|---|---|---|---|---|
| | BaO | SnO$_2$ | TiO$_2$ | B$_2$O$_3$ | | $\epsilon_s$ [1 MHz] | tan δ [1 MHz] ($\times 10^{-4}$) | $\rho$ ($\times 10^{13}$ Ω·cm) | $\alpha$ ($10^{-6}$/C) | after 25 hr. | after 50 hr. |
| 31 | 34.51 | 13.56 | 26.34 | 31.54 | 950 | 10.8 | 7.0 | 9.5 | 6.2 | 0 | 0 |
| 32 | 32.70 | 20.97 | 9.56 | 36.77 | 930 | 9.9 | 7.2 | 12.5 | 6.1 | 0 | 0.19 |
| 33 | 25.60 | 7.00 | 26.90 | 40.50 | 800 | 11.2 | 8.5 | 9.4 | 8.5 | 0 | 0.05 |
| 34 | 20.75 | 28.90 | 5.00 | 45.35 | 900 | 9.5 | 5.0 | 7.5 | 8.3 | 0 | 0.08 |
| 35 | 9.84 | 25.80 | 15.31 | 49.05 | 820 | 10.2 | 6.5 | 25.5 | 7.2 | 0 | 0.07 |
| 36 | 31.20 | 10.00 | 23.90 | 34.90 | 890 | 10.9 | 7.5 | 1.8 | 7.5 | 0 | 0.06 |
| 37 | 32.51 | 18.30 | 11.60 | 37.59 | 910 | 10.4 | 6.5 | 2.7 | 5.8 | 0 | 0 |
| 38 | 51.41 | 16.03 | 19.86 | 12.70 | 1200 | 9.8 | 12 | 1.5 | 8.1 | 0 | 0.10 |
| 39 | 15.71 | 8.50 | 45.20 | 30.59 | 1100 | 12 | 9 | 0.9 | 7.8 | 0 | 0.20 |
| 40 | 21.30 | 35.50 | 7.50 | 35.70 | 970 | 9.5 | 7.5 | 0.7 | 3.5 | 0 | 0 |

TABLE I (4)

| Sample No. | Composition in ratio (mol %) | | | | Firing temp. (°C.) | Values of characteristics | | | | Coefficient of water absorption (mg/cm$^3$) | |
|---|---|---|---|---|---|---|---|---|---|---|---|
| | BaO | SnO$_2$ | TiO$_2$ | B$_2$O$_3$ | | $\epsilon_s$ [1 MHz] | tan δ [1 MHz] ($\times 10^{-4}$) | $\rho$ ($\times 10^{13}$ Ω·cm) | $\alpha$ ($10^{-6}$/C) | after 25 hr. | after 50 hr. |
| 41 | 52.73 | 27.61 | 8.95 | 10.71 | 1300 | 9.3 | 6.5 | 5.5 | 7.5 | 0 | 0.15 |
| 42 | 30.85 | 17.84 | 16.40 | 34.91 | 940 | 10.2 | 5.2 | 4.6 | 6.4 | 0 | 0 |
| 43 | 33.50 | 25.43 | 8.47 | 32.60 | 1000 | 9.6 | 5.0 | 2.0 | 6.2 | 0 | 0 |
| 44 | 31.67 | 9.50 | 22.33 | 36.50 | 900 | 11.5 | 7.0 | 1.4 | 6.5 | 0 | 0.12 |
| 45 | 25.20 | 13.80 | 7.50 | 53.50 | 800 | 7.5 | 5.5 | 21.5 | 9.0 | 0 | 0.16 |
| 46 | 39.48 | 42.86 | 4.50 | 13.16 | 1230 | 10.5 | 25.0 | 1.5 | 3.7 | 2.5 | 4.0 |
| 47 | 14.35 | 9.86 | 50.54 | 25.25 | 1050 | 13.5 | 15.0 | 0.8 | 8.0 | 3.5 | 5.0 |
| 48 | 31.94 | 36.97 | 3.70 | 27.39 | 1170 | 9.5 | 13.0 | 12.5 | 4.5 | 3.0 | 4.5 |
| 49 | 17.35 | 5.75 | 54.50 | 22.40 | 1100 | 14.0 | 18.0 | 0.7 | 8.5 | 4.0 | 5.5 |

As can be clearly seen from Table 1, it is possible to attain the goal of a baking or firing temperature of less than 1300° C. with any of the examples of the present invention. Superior results were especially obtained in the range of BaO 17 to 48 mol %, SnO$_2$ 20 to 45 mol %, and B$_2$O$_3$ 23 to 56 mol % with the firing temperature below 1100° C., whereby the coefficient of thermal expansion was less than 6.1×10$^{-6}$/°C. Also, the firing temperature is below 1050° C., especially if in the range of BaO 18 to 39 mil %, SnO$_2$ 23 to 40 mol %, and B$_2$O$_3$ 30 to 54 mol %, and this example is effective when the characteristics are taken into consideration. Superior characteristics are shown, being a dielectric loss of about up to 10$^{-4}$, and an insulation resistance of up to 8×10$^{-4}$. Other characteristics have adequate values. In addition, cracking was not produced with a thermal shock test, e.g., by cooking from 400° C. down to 25° C. Frexural strength was not shown, but in all cases more than 1000 kg/cm$^2$ was obtained. In this respect, the alumina substrate produces cracks with the same thermal shock test. From the comparative examples (Sample Nos. 26 to 30), as is clearly shown, on leaving this range, the firing temperature becomes higher (Sample No. 30), the insulation resistance becomes smaller (Samples Nos. 26 and 27), and the coefficient of thermal expansion becomes larger (Sample Nos. 28 and 29), which is a deterioration of the characteristics as an insulating substrate.

In addition, as is clearly seen from the comparative examples (Sample Nos. 46 to 49), as the TiO$_2$ content goes out of the range of the present invention, the coefficient of water absorption becomes large and the moisture resistance deteriorates. In this respect, Sample Nos. 37 and 42, after even 100 hours, are at most 0.5 mg/cm$^3$ or less, which is highly superior.

EXAMPLE 2

We will now explain a method for forming a multilayered wire substrate through simultaneous sintering with reference to the insulating substrate of the present invention.

First a slurry is prepared containing powdered raw materials in a desired component ratio of BaO, SnO$_2$, Ba$_2$O$_3$, and, if required, TiO$_2$. This slurry is prepared by adding to the powdered raw materials a binding agent, such as polyvinyl butyral, a plasticizer, such as dioctyl phthalate or polyethylene glycol, a peptizer, such as menhaden oil, and a solvent, such as ethyl alcohol or trichloroethylene. Using this slurry a green sheet is prepared using the doctor blade method. Next, using a conducting paste, such as a silver-based paste, a first conducting layer is applied by printing, followed by drying. Next, an insulating paste containing the powdered raw materials in the desired component ratio of BaO, SnO$_2$, B$_2$O$_3$, and TiO$_2$, if required, is applied to the first conducting layer by printing. After drying, a second conducting layer is formed in the same way. The insulating paste is prepared into paste form by adding butyl carbitol acetate, terpineol, ethyl cellulose and the like, and applied.

In this way, a green sheet provided with two layers of wiring is formed and heated in an electric oven e.g., for three hours at about 1000° C., thereby producing a multilayered wiring substrate.

In order to produce a multilayered wiring substrate having more than two layers, the similar printing and drying steps as mentioned above are repeated as required before the simultaneous sintering.

The characteristics of this multilayer wiring substrate, formed by means of simultaneous sintering of the layers, are shown in Table 1. The adhesion strength values shown in this table indicate the degree of adhesion between the substrate and the conducting layers, measured by bonding a wire for tension test by soldering to the second conducting layer and using an Instron tensile tester (tension speed 0.5 cm/min).

In addition, the wire bonding characteristics shows the adhesion strength between the conducting layer and the Au-, Al-based 25 μm diameter bonding wires. The sample numbers in the table refer to the ceramic raw material powders of the composition in ratio in Table 1. Each characteristic is the average value of ten samples.

The following conclusions can be drawn from these tables.

The adhesion strength and bonding characteristics are all above 1 kg/mm$^2$ and above 5 gm, respectively, which give no problem in actual practice, and all examples adequately meet these requirements. The sheet resistances also are able to attain the set value of the conducting paste.

The baking temperature required during simultaneous firing varies according to the composition of the sample, but 800° C. to 1200° C. is desirable. When the firing temperature is too high, boron, that is, B$_2$O$_3$ is easily vaporized, resulting that it becomes difficult to obtain a uniform substrate. At temperatures in excess of 1200° C., Au and Ag are dispersed throughout the ceramic, and a good sheet resistance becomes unattainable.

TABLE III

| No. | Type of conducting paste | Firing temp. (°C.) | Sheet resistance (m Ω/sq.) | Conducting layer (μm) |
|---|---|---|---|---|
| A | Ag—Pd | 850–950 | 3–8 | 10–15 |
| B | Ag—Pd | 780–1000 | 20–30 | 8–13 |
| C | Au—Pt | 900–1030 | 30–50 | 10–15 |
| D | Ag—Pt | 550–950 | 3–6 | 12.5 |
| E | Ag—Pt | 550–980 | 15–25 | 12.5 |
| F | Au | 850–1000 | 2–3 | 16–19 |
| G | Au | 850–1000 | 3–4 | 7–10 |

EXAMPLE 3

The following is a process for producing a circuit substrate of the present invention, which comprises a first step wherein a mixture is provided with the prescribed quantities of the powdered raw materials, which produces barium oxide, tin oxide, and boron oxide;

a second step wherein pre-baking or calcination of the mixed raw materials is carried out for more than 10 hours at a temperature between 950° C. and 1100° C.;

a third step wherein the material resulting from the pre-baking or calcination in the second step is pulverized;

a fourth step wherein the powder resulting from the third step is fired at temperatures below 1200° C. to obtain the desired product.

The raw materials used in the first step are compounds, such as oxides, carbonates and oxalates containing Ba, Sn, and B which produces oxides after firing.

To obtain the raw materials in powder form, it is necessary to finely pulverize raw materials such as BaO, BaCO$_3$, SnO$_2$, B$_2$O$_3$, and H$_3$BO$_3$. The usual procedures used are the dry grinding method in which solvents are not employed, and the wet grinding method using a solvent such as water or alcohol.

When the dry grinding method is used, it is desirable to pulverize the respective raw materials such as BaO, SnO$_2$, and H$_3$BO$_3$ in a V-type mixer to a particle size of less than 2 μm before they are mixed together. If the grinding is carried out after the individual ingredients have been blended, there is a wide spread in the particle sizes of the individual components, making it difficult to obtain Ba Sn (BO$_3$)$_2$.

Also, when the wet grinding method is employed, using a vibration mill, it is not particularly necessary to grind the components individually. However, the individual grinding may be used with good effect. In the case where raw materials such as H$_3$BO$_3$ which are dissolved in a solvent are used, the theoretical quantities may be out of balance, so it is a good policy to make allowance for this in the quantities used. For example, 30 mol % of H$_3$BO$_3$ could be blended. After this step, the solvent is driven off by evaporation, but in order to

TABLE II

| Sample No. | Conducting Paste | Simultaneous firing temperature (°C.) | adhesion strength (kg/mm$^2$) | Bonding characteristics Wire | Strength (g) | Sheet Resistance (m Ω/sq.) | Conductior thickness (μm) |
|---|---|---|---|---|---|---|---|
| 12 | A | 950 | 1.6 | Au | 7 | 5 | 12 |
| 16 | B | 1000 | 1.4 | Al | 9 | 25 | 11 |
| 7 | C | 1030 | 1.2 | Au | 6.5 | 40 | 14 |
| 10 | D | 850 | 2.0 | Au | 8 | 3 | 13 |
| 21 | E | 900 | 1.5 | Al | 6 | 20 | 12.5 |
| 19 | F | 870 | 2.5 | Au | 10 | 3 | 16 |
| 25 | G | 980 | 1.2 | Al | 11 | 4 | 8 | reduce the losses of the most volatile materials such as $B_2O_3$, it is desirable to maintain the temperature below 120° C. during this operation.

For this reason, it is preferable to use the dry grinding method in order to obtain Ba Sn $(BO_3)_2$ at a high purity of 90 mol %. This method also simplifies the process by reducing the number of steps used.

The pre-baking or calcination of the resulting powder from the second operation is a very important operation. Pre-baking or calcination is carried out at a temperature of between 950° C. and 1100° C. If a temperature of less than 950° C. is used, the problem arises that the Ba Sn $(BO_3)_2$ will not be obtained in sufficiently pure form, greater than 90 mol %. On the other hand, if a temperature of 1100° C. is exceeded, the $SnO_2$ will precipitate, and it becomes difficult to obtain Ba Sn $(BO_3)_2$ at greater than 90 mol %. A time exceeding 10 hours is also necessary. A shorter time gives rise to the problem that Ba Sn $(BO_3)_2$ of adequate purity will not be obtained. Pre-baking or calcination must be carried out a lower temperature for a longer time. Although these conditions are not unconditionally set, a pre-baking or calcination for greater than 20 hours at a temperature between 950° C. and 1050° C. can provide a pre-baked substance containing more than 95 mol % Ba Sn $(BO_3)_2$. The sintereed body of highly pure Ba Sn $(BO_3)_2$ has superior moisture-resisting properties.

The pulverizing of this pre-baked substance (the third step) can be done in a centrifugal mill or a general-purpose grinding machine, wherein, in order for the product to exhibit the most important characteristic, namely a low-temperature sintering, it is desirable to obtain particles with a diameter less than 2 μm, and preferably less than 1.5 μm.

In the fourth step of baking or firing, it is necessary to carry out the baking or firing process at less than 1200° C. If this temperature is exceeded, $SnO_2$ will be precipitated, and it will become difficult for the Ba Sn $(BO_3)_2$ throughout the fired substance to exceed 90 mol %.

EXAMPLE 4

It is acceptable to use a sintered body such as that prepared in Example 3 as a substrate body. However, better results can be shown by using the sintered body as a wiring layer substrate for multilayer wiring. A multilayer wiring substrate can be formed by simultaneously sintering by producing a slurry from the powdered raw material with a Ba Sn $(BO_3)_2$ content of greater than 90 mol % obtained from the above-mentioned third step, and the method up to simultaneous sintering from the slurry production is the same as the forming method for the multilayer wiring substrate of Example 2.

EXAMPLE 5

Pellets were prepared using the powder of greater than 90 mol % Ba Sn $(BO_3)_2$ obtained from Example 3 by first adding polyvinyl alcohol (PVA) Vg as a binder, and granulating.

Following this, the pellets were formed by filling the powder into a mold and subjected to a forming pressure of about 1000 kg/cm², and were heated in air for three hours at 800° C. to 1200° C. and prepared as samples.

Figure 2:
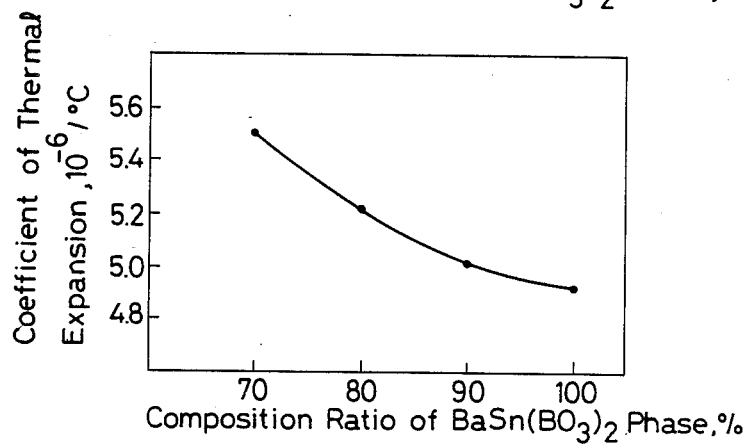
Figure 3:
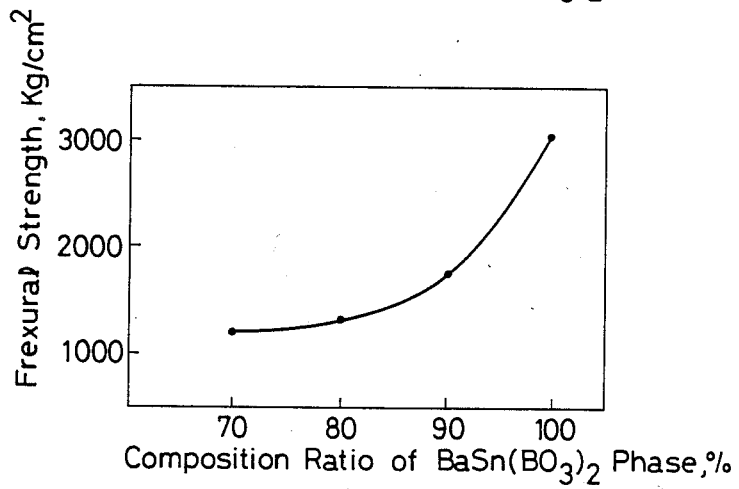

Disk-shaped samples of 22 mm diameter and 1 mm thickness, rod-shaped samples of 20×3.5×3.5 mm, and rectangular samples of 20×10×2 mm were prepared, and the characteristics measured. The results are shown in FIG. 1 to FIG. 3.

The coefficient of water absorption was measured in the following manner. Taking the dry mass of the material as Wo, and the mass at time of water absorption as W, the coefficient of water absorption, m, is defined as $$m = (W - Wo)/Wo \qquad (1)$$

The substrate in this example was inserted into water, and boiled for one hour at 100° C., after which W was measured and m was calculated.

The coefficient of thermal expansion was measured, using the rod shaped samples, as the temperature was varied from 25° C. to 500° C.

The flexural strength (τ) was determined, using rectangular sample plates (width W=10 mm, thickness t=2 mm), by measuring the maximum breaking load, Pm, at a span distance (l) of 7 mm, and calculating the flexural strength from the following formula.

$$\tau = 3/2 \cdot Pm \cdot l / w \cdot t^2 [kg/cm^2] \qquad (2)$$

The purity of the substrate (the composition ratio of the Ba Sn $(BO_3)_2$ phase) was calculated using X-ray diffraction from the ratio of the areas under the Ba Sn $(BO_3)_2$ peak to the area under the peaks for the other chemical compounds.

FIG. 1 shows the relationship between the coefficient of water absorption and the composition ratio of the Ba Sn $(BO_3)_2$ phase. The coefficient of water absorption is 5% for a Ba Sn $(BO_3)_2$ content of 70%, 0.01% for 90%, and 0.0% for 100%.

FIG. 2 shows the relationship between the coefficient of thermal expansion and the composition ratio of the Ba Sn $(BO_3)_2$ phase. As the composition ratio increase, the coefficient of thermal expansion decreases. At 90% to 100%, the coefficient of thermal expansion equals 4.9 to 5.0 ($\times 10^{-6}$/°C.), very close to the coefficient of thermal expansion for silicon ($4 \times 10^{-6}$/°C.), making this substrate material appropriate for direct mounting of an IC chip. That is to say, it is possible to produce a substrate in which there will be an extremely small amount of distortion between the IC and the substrate with variation in temperature.

FIG. 3 shows the relationship between the flexural strength of the substrate and the composition ratio of the Ba Sn $(BO_3)_2$ phase. The flexural strength is 1350 kg/cm² at a composition ratio of 70% for the Ba Sn $(BO_3)_2$ phase, and increase as the composition ratio increases. At 90% the value becomes 1700 kg/cm2, and at 100% it increases to 3050 kg/cm2. This substrate has superior resistance to impact.

As can be seen from FIGS. 1 to 3, this substrate has superior characteristics, such that as when the composition ratio of the Ba Sn $(BO_3)_2$ phase in the substrate is greater than 90%, the coefficient of water absorption is less than 0.01%, the coefficient of thermal expansion is less than $5.0 \times 10^{-6}$/°C. and the flexural strength is greater than 1700 kg/cm2.

For measurement of dielectric constants and dielectric loss, and insulation resistance, circular electrodes were formed as follows. Ag paste was printed in a concentric pattern on both sides of the disk-shaped sample, by 325 mesh screen printing, and after drying, was heated at 750° C. in air for 20 minutes. Circular electrodes, 20 mm in diameter by 15 μm thickness, were then formed and the measurements made. The dielectric constant and dielectric loss are the values at 1 MHz, and the insulation resistance is the lowest value taken one minute after applying 1000 v at conditions of 25° C. and 50% relative humidity. These values do not greatly change in relation to changes in the composition ratio of the Ba Sn $(BO_3)_2$ phase. In the 70% to 100% range, the dielectric constant ranges from 9.5 to 10.5, the dielectric loss from $2 \times 10^{-4}$ to $5 \times 10^{-4}$ while the insulation resistance is about $10^{14}$ ohm-cm. These are superior values for a substrate material.

Table 4 shows the characteristics for this multilayer wiring substrate. The adhesion strength values shown in this table indicate the degree of adhesion between the sustrate and the conducting layers, measured at tension speed of 0.5 cm/min using an Instron tensile tester, with tensile testing wires soldered to the uppermost conductor layer. In addition, the wire bonding characteristics show the bonding strength between the conducting layer and the Au-, al-based 25 μm diameter bonding wires. Each characteristic is the average value of ten samples.

TABLE IV

| Sample No. | Composition Ratio of BaSn(BO_3)_2 Phase (%) | Conducting Paste | Simultaneous firing temperature (°C.) | adhesion strength (kg/mm$^2$) | Bonding characteristics | | Sheet Resistance (m Ω/sq.) | Thickness of conductor layer (μm) |
|---|---|---|---|---|---|---|---|---|
| | | | | | Wire | Strength (g) | | |
| 1 | 90 | A | 930 | 1.5 | Au. | 7.5 | 7 | 11 |
| 2 | 100 | B | 1000 | 2.5 | Al. | 9.7 | 20 | 13 |
| 3 | 99 | C | 1020 | 2.3 | Au. | 7.0 | 42 | 12.5 |
| 4 | 97 | D | 970 | 2.0 | Au. | 8.5 | 6 | 10 |
| 5 | 95 | E | 950 | 1.6 | Al. | 6.8 | 25 | 12 |
| 6 | 92 | F | 940 | 1.8 | Au | 9.5 | 2.5 | 17 |
| 7 | 98 | G | 980 | 2.3 | Al. | 10.5 | 3.7 | 9 |

The characteristics of the conducting pastes used in Table 4 are given in Table 3.

In this example of the present invention, the adhesion strength and bonding characteristics are the same as those given in Example 2.

Table 5 gives the coefficient of water absorption (difference in weight between before and after test conditions) obtained in a pressure cooker test (121° C., 2 kg/cm$^2$, in steam) versus the composition ratio of the Ba Sn $(BO_3)_2$ phase, which varied as a result of changes in the production conditions.

TABLE 5

| BaSn(BO_3)_2 content (mol %) | Coefficient of water absorption (mg/cm$^3$) |
|---|---|
| 97.7 | 0 |
| 95 | 0.2 |
| 90 | 0.5 |
| 70 | 5 |

Here, it is seen that superior moisture resistance is obtained for composition ratios above 90 mol %, and especially 95 mol %.

Other objects and further scope of applicability of the present invention will become apparent from the detailed description given above. It should be understood, however, that the detailed descriprion of a specific example, while indicating a preferred example of the invention, is given by way of illustration only, since various changes and modifications within the spirit and scope of the invention will become apparent from this detailed descriprion to those skilled in the art.

For example, in the Example 2, reference is made to printed layers, and also to so-called green sheet layers.

In this method, first a green sheet is made with a thickness of about 100 μm, using the doctor blade method. A conducting pattern is printed on one side of this sheet, then similar sheets are prepared and piled one on top of the other, and the sheets are laminated under a pressure of about 200 kg/cm$^2$ and a temperature of about 50° C. This results in multilayer wiring. Simultaneous baking is carried out in the same way.

In addition, the circuit substrate of the present invention can be used effectively as a base for multilayer printing, but other substrates, such as $Al_2O_3$ substrate, and Mullite substrate can also be used.

Such variations are not to be regarded as a departure from the spirit and scope of the invention, and all such modifications are intended to be included within the scope of the following claims.

What is claimed is:

1. A circuit substrate comprising a sintered oxide body used as an insulating body, said sintered oxide body consisting essentially of barium, tin, and boron equivalent to: BaO 10 to 68 mol %, $SnO_2$ 9 to 50 mol %, and $B_2O_3$ 13 to 72 mol %.

2. The circuit substrate of claim 1 comprising a sintered oxide body used as an insulating body, said sintered oxide body consisting essentially of barium, tin and boron equivalent to: BaO 17 to 48 mol %, $SnO_2$ 20 to 45 mol %, and $B_2O_3$ 23 to 56 mol %.

3. The circuit substrate of claim 1 comprising a sintered oxide body used as an insulating body, said sintered oxide body consisting essentially of barium, tin and boron equivalent to: BaO 18 to 39 mol %, $SnO_2$ 23 to 40 mol %, and $B_2O_3$ 30 to 54 mol %.

4. The circuit substrate of claim 1, wherein said sintered oxide body includes Ba Sn $(BO_3)_2$ in a quantity greater than 90 mol %.

5. The circuit substrate of claim 4, wherein said Ba Sn $(BO_3)_2$ is present in an amount greater than 95 mol %.

6. A circuit substrate comprising a sintered oxide body used as an insulating body, said sintered oxide body consisting essentially of barium, tin, boron and titanium equivalent to: BaO 8 to 54 mol %, $SnO_2$ 7 to 40 mol %, $B_2O_3$ 10 to 58 mol %, and $TiO_2$ 5 to 48 mol %.

7. The circuit substrate of claim 6 comprising a sintered oxide body used as an insulating body, said sintered oxide body consisting essentially of barium, tin, boron and titanium equivallent to: BaO 11 to 36 mol %, $SnO_2$ 12 to 38 mol %, $B_2O_3$ 14 to 45 mol %, and $TiO_2$ 7 to 40 mol %.

8. The circuit substrate of claim 6 comprising a sintered oxide body used as an insulating body, said sintered oxide body consisting essentially of barium, tin, boron and titanium equivallent to: BaO 12 to 35 mol %, $SnO_2$ 11 to 32 mol %, $B_2O_3$ 15 to 40 mol %, and $TiO_2$ 10 to 36 mol %.

9. The circuit substrate of claim 1, wherein said sintered oxide body has a dielectric constant of from about 7.2 to about 10.5.

10. The circuit substrate of claim 6 wherein said sintered oxide body has a dielectric constant of less than about 12.

11. The circuit substrate of claim 4, wherein the substrate has a coefficient of water absorption of less than 0.01%, a coefficient of thermal expansion of less than $5.0 \times 10^{-6}/°C$., and a flexural strength of greater than 1700 kg/cm$^2$.

12. In a circuit configuration comprising a circuit substrate and a circuit applied thereto, said circuit substrate comprising a sintered oxide body consisting essentially of barium, tin and boron equivalent to: BaO 10 to 68 mol %, SnO$_2$ 9 to 50 mol %, and B$_2$O$_3$ 13 to 72 mol %.

* * * * *